United States Patent
Soda

(10) Patent No.: US 9,257,472 B2
(45) Date of Patent: Feb. 9, 2016

(54) SOLID-STATE IMAGING DEVICE, CAMERA, AND DESIGN METHOD FOR SOLID-STATE IMAGING DEVICE

(71) Applicant: CANON KABUSHIKI KAISHA, Tokyo (JP)

(72) Inventor: Takehiko Soda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/662,582

(22) Filed: Mar. 19, 2015

(65) Prior Publication Data

US 2015/0194457 A1 Jul. 9, 2015

Related U.S. Application Data

(63) Continuation of application No. 13/667,880, filed on Nov. 2, 2012, now Pat. No. 9,026,972.

(30) Foreign Application Priority Data

Dec. 5, 2011 (JP) ................................ 2011-266274

(51) Int. Cl.
  *H01L 27/146* (2006.01)
  *H01L 27/148* (2006.01)
  *H04N 5/3745* (2011.01)

(52) U.S. Cl.
  CPC ...... *H01L 27/14634* (2013.01); *H01L 27/1464* (2013.01); *H01L 27/14636* (2013.01); *H01L 27/14831* (2013.01); *H04N 5/37457* (2013.01)

(58) Field of Classification Search
  None
  See application file for complete search history.

(56) References Cited

U.S. PATENT DOCUMENTS

| | | | |
|---|---|---|---|
| 6,150,682 A | 11/2000 | Sawada et al. | |
| 7,687,299 B2 * | 3/2010 | Ichikawa | H01L 27/14806 257/E27.132 |
| 7,906,827 B2 * | 3/2011 | Katsuno | H01L 27/14603 250/226 |
| 8,349,640 B2 | 1/2013 | Soda | |
| 8,669,602 B2 * | 3/2014 | Hayashi | 257/292 |
| 8,878,267 B2 * | 11/2014 | Inui | 257/292 |
| 8,947,566 B2 * | 2/2015 | Kobayashi et al. | 348/294 |
| 2004/0263657 A1 | 12/2004 | Sakamoto et al. | |
| 2006/0113460 A1 | 6/2006 | Tay | |
| 2007/0069258 A1 * | 3/2007 | Ahn | 257/290 |
| 2007/0080404 A1 | 4/2007 | Fukuro et al. | |

(Continued)

FOREIGN PATENT DOCUMENTS

| JP | 2009-170448 A | 7/2009 |
|---|---|---|
| JP | 2011-129784 A | 6/2011 |

OTHER PUBLICATIONS

Jan. 12, 2015 Chinese Office Action issued to corresponding Chinese Patent Application No. 201210505763.2.

*Primary Examiner* — Michael Osinski
(74) *Attorney, Agent, or Firm* — Fitzpatrick, Cella, Harper & Scinto

(57) ABSTRACT

A solid-state imaging device including two semiconductor substrates arranged in layers is provided. Each semiconductor substrate has a semiconductor region in which a circuit constituting a part of a pixel array is formed. The circuits in the two semiconductor substrates are electrically connected to each other. Each semiconductor substrate includes one or more contact plugs for supplying a voltage to the semiconductor region. The number of the contact plugs of one semiconductor substrate in the pixel array is different from the number of the contact plugs of the other semiconductor substrate in the pixel array.

11 Claims, 5 Drawing Sheets

(56) References Cited

U.S. PATENT DOCUMENTS

| | | |
|---|---|---|
| 2008/0173966 A1 | 7/2008 | Lin |
| 2008/0224146 A1 | 9/2008 | Ichikawa |
| 2009/0026563 A1 | 1/2009 | Katsuno et al. |
| 2009/0200069 A1 | 8/2009 | Kariya et al. |
| 2009/0230287 A1* | 9/2009 | Anderson et al. .......... 250/208.1 |
| 2009/0284306 A1 | 11/2009 | Chen |
| 2010/0006936 A1 | 1/2010 | Matsudai et al. |
| 2010/0148220 A1* | 6/2010 | Byeon .................. H01L 27/105 257/208 |
| 2010/0225776 A1* | 9/2010 | Taura ................ H01L 27/14609 348/222.1 |
| 2010/0238334 A1* | 9/2010 | Takahashi ..................... 348/305 |
| 2011/0049336 A1* | 3/2011 | Matsunuma ...... H01L 27/14609 250/214.1 |
| 2011/0068406 A1 | 3/2011 | Yasuhara et al. |
| 2011/0073923 A1* | 3/2011 | Tatani ............... H01L 27/14603 257/291 |
| 2011/0096215 A1* | 4/2011 | Choi et al. .................... 348/294 |
| 2011/0155893 A1* | 6/2011 | Endo ................. H01L 27/14632 250/208.1 |
| 2011/0220969 A1 | 9/2011 | Masuoka et al. |
| 2011/0234873 A1* | 9/2011 | Yamakawa ........ H01L 27/14603 348/300 |
| 2012/0119300 A1 | 5/2012 | Kim et al. |
| 2012/0248293 A1 | 10/2012 | Yamazaki et al. |
| 2013/0001730 A1* | 1/2013 | Miyanami ......... H01L 27/14603 257/443 |
| 2013/0037868 A1 | 2/2013 | Okamoto et al. |
| 2013/0107075 A1* | 5/2013 | Kobayashi ........ H01L 27/14636 348/222.1 |
| 2013/0113060 A1* | 5/2013 | Matsunaga ....... H01L 27/14632 257/431 |
| 2013/0140442 A1* | 6/2013 | Yanagita ................. H01L 31/08 250/214 A |
| 2013/0267059 A1 | 10/2013 | Kim et al. |
| 2014/0246706 A1 | 9/2014 | Mori et al. |

\* cited by examiner

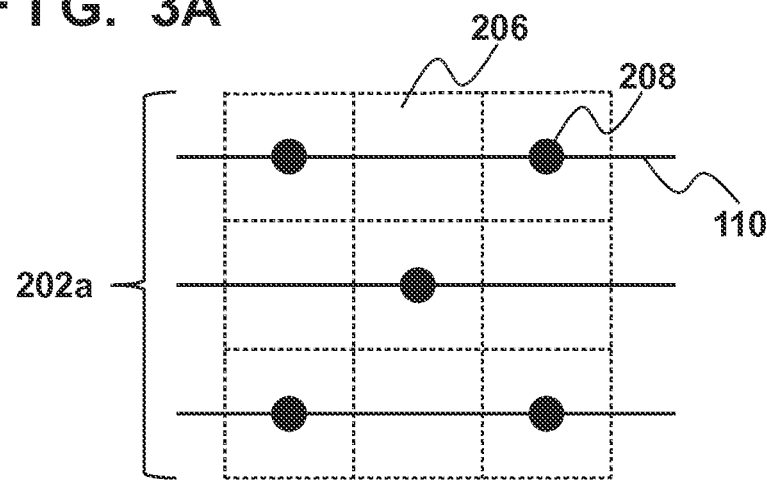
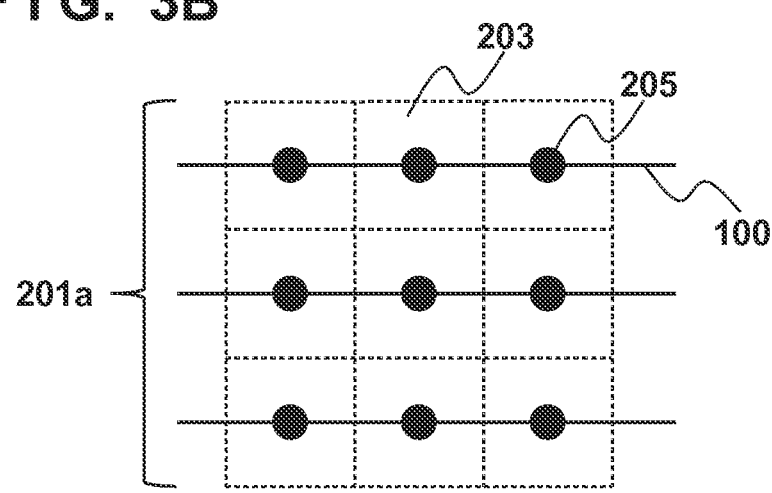

SOLID-STATE IMAGING DEVICE, CAMERA, AND DESIGN METHOD FOR SOLID-STATE IMAGING DEVICE

This application is a continuation of pending application Ser. No. 13/667,880, filed Nov. 2, 2012, which has been allowed.

BACKGROUND OF THE INVENTION

1. Field of the Invention

The present invention relates to a solid-state imaging device, a camera, and a design method for a solid-state imaging device.

2. Description of the Related Art

One known configuration of a solid-state imaging device is to form a plurality of circuits separately on different substrates and electrically connect the plurality of circuits. In a solid-state imaging device described in Japanese Patent Laid-Open No. 2009-170448, a photodiode, a transfer transistor, a reset transistor and an amplifier transistor are formed on a sensor substrate, whereas a selection transistor and peripheral circuits are formed on a peripheral circuit substrate.

SUMMARY OF THE INVENTION

In solid-state imaging devices, in order to supply power supply voltage or ground potential to semiconductor regions in which circuit elements are formed, a power supply line or a ground line is connected to the semiconductor regions via contact plugs. Japanese Patent Laid-Open No. 2009-170448 does not make any proposals about how to arrange the contact plugs in a pixel array. In view of this, an aspect of the present invention offers advantageous arrangement of contact plugs for supplying a constant voltage to semiconductor regions of a solid-state imaging device in which circuits constituting a pixel array are formed separately on different substrates.

A first aspect of the present invention provides a solid-state imaging device including a first semiconductor substrate and a second semiconductor substrate arranged in layers, the first semiconductor substrate having a first semiconductor region in which a first circuit constituting a part of a pixel array is formed, the second semiconductor substrate having a second semiconductor region in which a second circuit constituting another part of the pixel array is formed, and the first circuit and the second circuit being electrically connected to each other, wherein the first semiconductor substrate includes one or more first contact plugs for supplying a first voltage to the first semiconductor region, the second semiconductor substrate includes one or more second contact plugs for supplying a second voltage to the second semiconductor region, and the number of the first contact plugs in the pixel array is different from the number of the second contact plugs in the pixel array.

A second aspect of the present invention provides a design method for a solid-state imaging device including a first semiconductor substrate and a second semiconductor substrate arranged in layers, the first semiconductor substrate having a first semiconductor region in which a first circuit constituting a part of a pixel array is formed, the second semiconductor substrate having a second semiconductor region in which a second circuit constituting another part of the pixel array is formed, and the first circuit and the second circuit being electrically connected to each other, the design method comprising: determining circuit elements included in the first circuit; determining circuit elements included in the second circuit; determining arrangement of one or more first contact plugs for supplying a first voltage to the first semiconductor region of the first semiconductor substrate; and determining arrangement of one or more second contact plugs for supplying a second voltage to the second semiconductor region of the second semiconductor substrate.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 3A and 3B are diagrams for schematically explaining an example of arrangement of contact plugs in the solid-state imaging device according to the first embodiment of the present invention.

DESCRIPTION OF THE EMBODIMENTS

Figure 1:
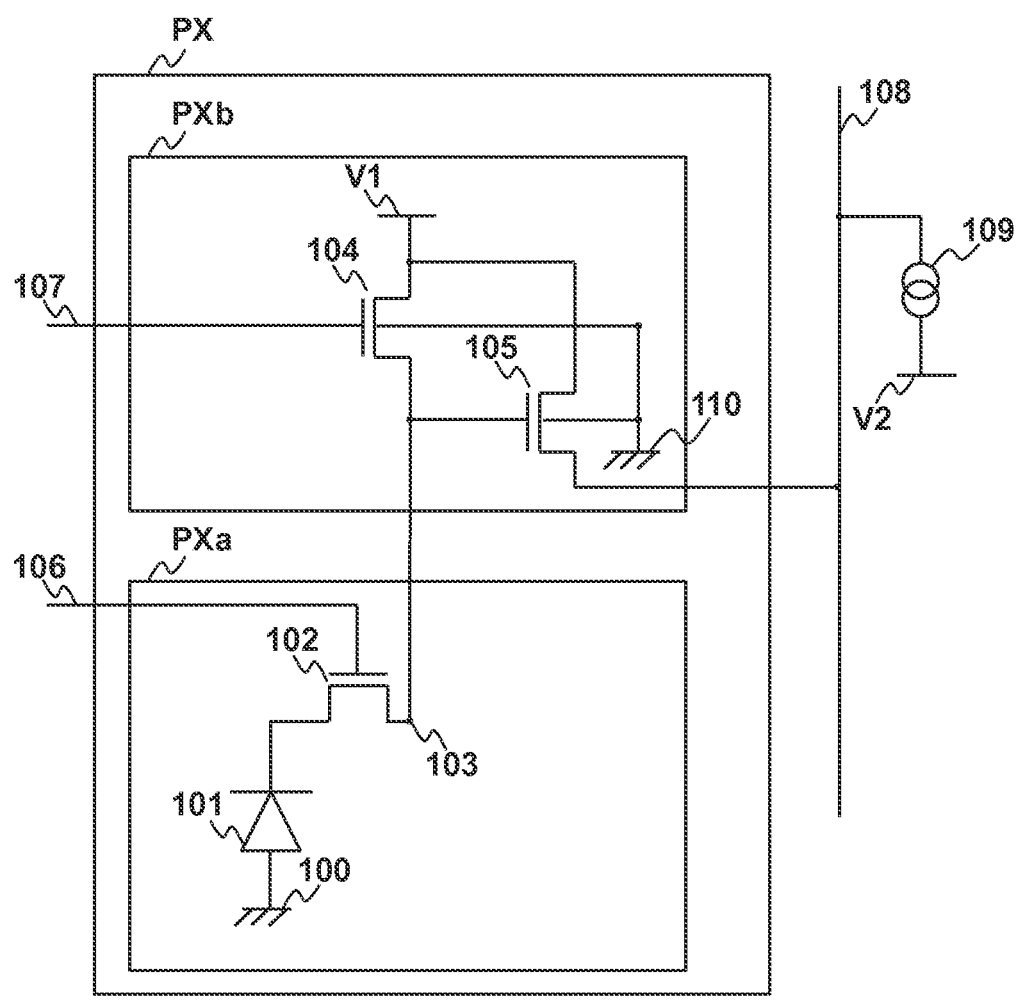
FIG. 1 is a diagram for explaining an example of equivalent circuits in a single pixel in a solid-state imaging device according to a first embodiment of the present invention.

The following describes embodiments of the present invention with reference to the accompanying drawings. Common elements of various embodiments are assigned the same reference numerals so as to avoid repetitive descriptions. The embodiments described below are parts of embodiments of the present invention. Therefore, the present invention is not limited to the embodiments described below. Known technologies in the art may be applied to matters that are not particularly illustrated or discussed in the present description.

A description is now given of a solid-state imaging device according to the first embodiment of the present invention with reference to FIGS. 1 to 3B. FIG. 1 is a diagram for explaining an example of equivalent circuits in a single pixel in the solid-state imaging device according to the first embodiment of the present invention. The solid-state imaging device according to the present embodiment includes two semiconductor substrates. Circuits constituting a pixel array are formed separately on the two semiconductor substrates. A pixel PX shown in FIG. 1 includes a circuit PXa (first circuit) and a circuit PXb (second circuit) that are respectively formed on a first semiconductor substrate and a second semiconductor substrate.

The circuit PXa may include a photoelectric conversion portion 101, a transfer transistor 102 and a floating diffusion (FD) 103. The photoelectric conversion portion 101 is constituted by, for example, a photodiode. As a result of photoelectric conversion, holes and electrons are generated. In the present embodiment, electrons are used as signal charges. Ground potential (a first constant voltage) is supplied from a ground line 100 to the photoelectric conversion portion 101 via a well region and a contact plug. The transfer transistor 102 functions as a transfer unit that transfers charges generated by the photoelectric conversion portion 101 to the FD 103 in a floating state. For example, an NMOS transistor is used as the transfer transistor 102. A driving pulse is supplied from a vertical scanning circuit (not shown in the figures) to the gate of the transfer transistor 102 via a control line 106. The photoelectric conversion portion 101 and the transfer transistor 102 are formed in a P-type well region (first semiconductor region).

The circuit PXb may include a reset transistor 104 and an amplifier transistor 105. The reset transistor 104 functions at least as a pixel reset unit that resets the potential of the FD 103 to reference potential. For example, an NMOS transistor is used as the reset transistor 104. One main electrode of the reset transistor 104 is electrically connected to the FD 103, and the other main electrode of the reset transistor 104 is electrically connected to a voltage source V1. In this way, the reset transistor 104 resets voltage of the input node of the amplifier transistor 105. When the transfer transistor 102 is turned to an on state while the reset transistor 104 is in an on state, the potential of the photoelectric conversion portion 101 is reset to reference potential as well. A driving pulse is supplied from the vertical scanning circuit (not shown in the figures) to the gate of the reset transistor 104 via a control line 107. The amplifier transistor 105 functions as a signal amplification unit that amplifies signals based on charges generated by the photoelectric conversion portion 101 and outputs the amplified signals to a signal line 108. For example, an NMOS transistor is used as the amplifier transistor 105. The gate of the amplifier transistor 105 is electrically connected to the FD 103. One main electrode of the amplifier transistor 105 is connected to the voltage source V1. Bias current is supplied from a current source 109 to the other main electrode of the amplifier transistor 105 via the signal line 108. This bias current causes the amplifier transistor 105 to operate as a source follower. The current source 109 is connected to a voltage source V2. The reset transistor 104 and the amplifier transistor 105 are formed in a P-type well region (second semiconductor region). Ground potential is supplied from a ground line 110 to the back gates of the reset transistor 104 and the amplifier transistor 105 via the well region and a contact plug.

Although NMOS transistors are used as the reset transistor 104 and the amplifier transistor 105 in the aforementioned example, PMOS transistors may instead be used thereas. In this case, the reset transistor 104 and the amplifier transistor 105 are formed in an N-type well region. Power supply voltage (a second constant voltage) is supplied from a voltage line to the back gates of the reset transistor 104 and the amplifier transistor 105. When a PMOS transistor is used as the amplifier transistor 105, the amplifier transistor 105 is opposite in polarity to signal charges (in the aforementioned example, electrons). Therefore, as the amount of light incident on the photoelectric conversion portion 101 increases, the gate potential of the amplifier transistor 105 decreases, and accordingly the source potential of the amplifier transistor 105 increases. As a result, when the signal amplitude is large compared to the time of reset, the signal line 108 can be driven at high driving level. This can increase the reading speed compared to when the PMOS transistor is used as the amplifier transistor 105.

Although electrons are used as the signal charges in the aforementioned example, holes may instead be used as the signal charges. In this case, a PMOS transistor is used as the transfer transistor 102, and the transfer transistor 102 is formed in an N-type well region. Power supply voltage is supplied from a power supply ground line to the photoelectric conversion portion 101 via the well region and a contact plug. When forming a pinning layer for suppressing dark current generated at a boundary surface between silicon and an oxide film of the photodiode, a conductivity type of the pinning layer may be N-type as with the well. In this case, arsenic and phosphorus, which enable formation of a steep dopant profile in the vicinity of the boundary surface between silicon and the oxide film, can be used as the pinning layer. Therefore, dark current can be suppressed more effectively than when the pinning layer is of P-type. When holes are used as the signal charges, the use of NMOS transistors having opposite polarities as the reset transistor 104 and the amplifier transistor 105 provides the effect of increasing the aforementioned reading speed.

Figure 2:
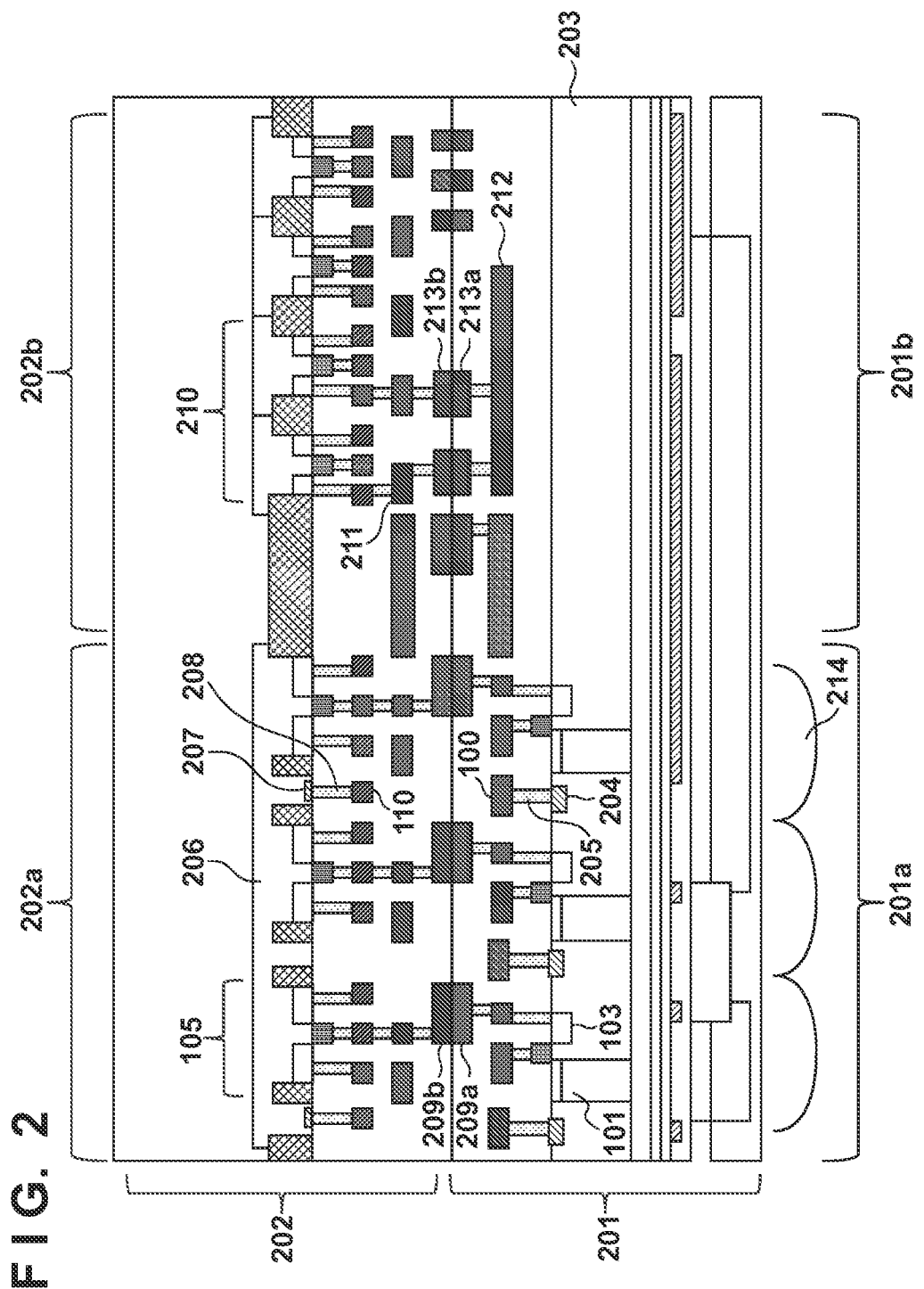
FIG. 2 is an exemplary schematic cross-sectional view of the solid-state imaging device according to the first embodiment of the present invention.

FIG. 2 is an exemplary schematic cross-sectional view of the solid-state imaging device according to the first embodiment of the present invention. The solid-state imaging device includes a semiconductor substrate 201 and a semiconductor substrate 202. A principal surface (a surface on which circuits are formed) of the semiconductor substrate 201 and a principal surface of the semiconductor substrate 202 are arranged facing each other. Circuits formed in a region 201a of the semiconductor substrate 201 and circuits formed in a region 202a of the semiconductor substrate 202 constitute a pixel array of the solid-state imaging device. In this pixel array, pixels PX that have been explained using FIG. 1 are arranged in three rows and three columns. Note that the number of pixels is not limited in this way. The circuit PXa of each pixel PX is formed in the region 201a of the semiconductor substrate 201, and the circuit PXb of each pixel PX is formed in the region 202a of the semiconductor substrate 202. Furthermore, circuits formed in a region 201b of the semiconductor substrate 201 and circuits formed in a region 202b of the semiconductor substrate 202 constitute peripheral circuits of the solid-state imaging device. The peripheral circuits may include, for example, a circuit that processes signals output from the pixel array and a circuit that supplies control signals to the pixel array. Although the reset transistors 104 that have been explained using FIG. 1 are omitted from FIG. 2, they may be formed in, for example, the region 202a of the semiconductor substrate 202.

The semiconductor substrate 201 includes a well region 203 in which the photoelectric conversion portions 101 and the FDs 103 are formed. When electrons generated by the photoelectric conversion portions 101 are used as the signal charges, the well region 203 is a P-type semiconductor region. On the other hand, when holes are used as the signal charges, the well region 203 is an N-type semiconductor region. That is to say, the conductivity type of the well region 203 is opposite to the conductivity type of the signal charges. Although the photoelectric conversion portions 101 of all pixels are formed in a single well region 203 in FIG. 2, each photoelectric conversion portion 101 may be formed in an individual well region. One end of each contact plug 205 is connected to a well contact region 204 inside the well region 203, and the other end of each contact plug 205 is connected to the ground line 100. In this way, ground potential is supplied from the ground line 100 to the well contact regions 204 via the contact plugs 205. The well contact regions 204 are semiconductor regions having the same conductivity type as the well region 203. The well contact regions 204 have a higher impurity concentration than the well region 203, and therefore supply an arbitrary voltage to the well region 203. Microlenses 214 are formed on the back surface of the semiconductor substrate 201 in the region 201a. The photoelectric conversion portions 101 are irradiated with light via the microlenses 214.

The semiconductor substrate 202 includes a well region 206 in which source regions and drain regions of the amplifier transistors 105 are formed. When the amplifier transistors 105 are NMOS transistors, the well region 206 is a P-type semiconductor region. On the other hand, when the amplifier transistors 105 are PMOS transistors, the well region 206 is an N-type semiconductor region. That is to say, the conductivity type of the well region 203 is opposite to the conductivity type of source electrodes and drain electrodes of the amplifier transistors. Although the amplifier transistors 105 of all pixels are formed in a single well region 206 in FIG. 2, each amplifier transistor 105 may be formed in an individual well region. One end of each contact plug 208 is connected to a well contact region 207 inside the well region 206, and the other end of each contact plug 208 is connected to the ground line 110. In this way, ground potential is supplied from the ground line 110 to the well contact regions 207 via the contact plugs 208. The well contact regions 207 are semiconductor regions having the same conductivity type as the well region 206. The well contact regions 207 have a higher impurity concentration than the well region 206, and therefore supply an arbitrary voltage to the well region 206.

The semiconductor substrate 201 has connection parts 209a that are partially exposed on the principal surface of the semiconductor substrate 201. The semiconductor substrate 202 has connection parts 209b that are partially exposed on the principal surface of the semiconductor substrate 202. When the principal surface of the semiconductor substrate 201 and the principal surface of the semiconductor substrate 202 are arranged facing each other, the connection parts 209a are connected to the connection parts 209b, and therefore the circuits on the semiconductor substrate 201 are electrically connected to the circuits on the semiconductor substrate 202. For example, the FDs 103 and the gates of the amplifier transistors 105 are electrically connected via the connection parts 209a and 209b. The connection parts 209a and 209b may be physically connected, or may be connected via conductive adhesives. The connection parts 209a and 209b may be formed as electrically conductive patterns of top wiring layers of the respective semiconductor substrates.

MOS transistors 210 that constitute, for example, a part of reading circuits are formed in the region 202b of the semiconductor substrate 202. The reading circuits are, for example, parallel processing circuits that process signals, that have been read with respect to each of a plurality of pixel columns, in parallel. Examples of such parallel processing circuits include column amplifiers and column analog-to-digital converters. The peripheral circuits may include circuits other than the parallel processing circuits.

The region 202b of the semiconductor substrate 202 has an electrically conductive pattern 211 that includes a voltage line for supplying a constant voltage to the MOS transistors 210 that constitute the parallel processing circuits. The electrically conductive pattern 211 extends in a depth direction of the paper plane in FIG. 2 and supplies a constant voltage to the MOS transistors 210 of all the parallel processing circuits. The region 201b of the semiconductor substrate 201 has an electrically conductive pattern 212. The semiconductor substrate 201 has connection parts 213a, and the semiconductor substrate 202 has connection parts 213b. The electrically conductive patterns 211 and 212 are electrically connected via the connection parts 213a and 213b. As with the connection parts 209a and 209b, the connection parts 213a and 213b may be formed as electrically conductive patterns of top wiring layers. The number of circuit elements arranged in the region 201b of the semiconductor substrate 201 is smaller than the number of circuit elements arranged in the region 202b of the semiconductor substrate 202. There may be cases where no circuit element is arranged in the region 201b of the semiconductor substrate 201. Therefore, when the electrically conductive pattern 212 is arranged in the region 201b, the layout of the electrically conductive pattern 212 can be decided with great flexibility, the area of the electrically conductive pattern 212 can be increased, and the resistance value of the electrically conductive pattern 212 can be decreased, compared to when the electrically conductive pattern 212 is arranged in the region 202b.

Although MOS transistors are used as the amplifier transistors 105 in the aforementioned example, junction gate field-effect transistors (JFETs) may instead be used as the amplifier transistors 105. Also, a plurality of photoelectric conversion portions 101 may share an amplifier transistor 105 and a reset transistor 104. Furthermore, the reset transistors 104 and/or the amplifier transistors 105 may be formed on the semiconductor substrate 201. Moreover, charges of the photoelectric conversion portions 101 may be directly output to the peripheral circuits via the signal line without forming the reset transistors 104 and the amplifier transistors 105 in the pixel array.

FIGS. 3A and 3B are diagrams for schematically explaining an example of arrangement of contact plugs in the solid-state imaging device according to the first embodiment of the present invention. FIG. 3A shows an example of arrangement of contact plugs 208 in the region 202a of the semiconductor substrate 202 where the pixel array is formed. FIG. 3B shows an example of arrangement of contact plugs 205 in the region 201a of the semiconductor substrate 201 where the pixel array is formed. For reference, borders between the pixels PX are conceptually shown as dotted lines in FIGS. 3A and 3B. As mentioned earlier, the pixel array includes nine pixels PX arranged in three rows and three columns. Note that FIGS. 3A and 3B only show elements necessary for explaining the arrangement of the contact plugs. Other elements, such as the photoelectric conversion portions 101, are omitted from FIGS. 3A and 3B.

Conventionally, circuit elements constituting a pixel array are formed on the same semiconductor substrate, and therefore ground potential is supplied from the same contact plug to a plurality of circuit elements formed in the same well region. For this reason, conventionally, the degree of flexibility in the arrangement of contact plugs has been restricted. As opposed to this, in the solid-state imaging device according to the present embodiment, circuit elements constituting the pixel array are arranged separately on the semiconductor substrate 201 and the semiconductor substrate 202. Therefore, the present embodiment allows forming the contact plugs 205 that supply ground potential to the well region 203 in the pixel array of the semiconductor substrate 201, independently from the contact plugs 208 that supply ground potential to the well region 206 in the pixel array of the semiconductor substrate 202. Accordingly, in the present embodiment, the arrangement of contact plugs is determined in accordance with characteristics of circuit elements formed on each semiconductor substrate.

As a design method, circuit elements to be formed on each semiconductor substrate are determined first. In the present embodiment, the photoelectric conversion portions 101, the transfer transistors 102 and the FDs 103 are formed on the semiconductor substrate 201, and the reset transistors 104 and the amplifier transistors 105 are formed on the semiconductor substrate 202. Next, the arrangement of contact plugs to be formed on each semiconductor substrate is determined.

In the present embodiment, the number of one or more contact plugs 205 (first contact plugs) in the pixel array of the semiconductor substrate 201 is greater than the number of one or more contact plugs 208 (second contact plugs) in the pixel array of the semiconductor substrate 202. More specifically, one contact plug 205 is arranged for every pixel on the semiconductor substrate 201, whereas one contact plug 208 is arranged for every two pixels on the semiconductor substrate 202. Arranging one contact plug 205 for every photoelectric conversion portion 101 allows suppressing overflow of signal charges of the photoelectric conversion portions 101 when they have exceeded the state of saturation. Furthermore, in the case of a single-plate sensor with color filters, when signal charges of the photoelectric conversion portions 101 overflow after they have exceeded the state of saturation, it is possible to suppress uneven introduction of the signal charges into adjacent pixels of other colors. This can prevent deterioration of color reproducibility of images taken with high illuminance. In addition, by reducing the number of contact plugs 208 that supply ground potential to the well region 206 in the pixel array of the semiconductor substrate 202, the gate areas of the amplifier transistors 105 can be increased, and the occurrence of 1/f noise that is inversely proportional to the gate areas can be suppressed. Accordingly, the present embodiment can achieve improvement in color reproducibility at the time of high-illuminance imaging, as well as noise reduction at the time of low-illuminance imaging.

Although one ground line 110 is arranged for every pixel row in the examples of FIGS. 3A and 3B, one ground line 110 may be arranged for a plurality of pixel rows as long as a desired voltage can be supplied to the well region 206. Furthermore, although a pixel that is provided with a contact plug 208 and a pixel that is not provided with a contact plug 208 are alternately arranged on the semiconductor substrate 202, they may not be arranged in such a cyclic fashion, but may be randomly arranged. Moreover, although one contact plug 205 is arranged for every pixel on the semiconductor substrate 201, a plurality of contact plugs 205 may be arranged for one pixel, or one contact plug 205 may be arranged for a plurality of pixels.

Figure 4:
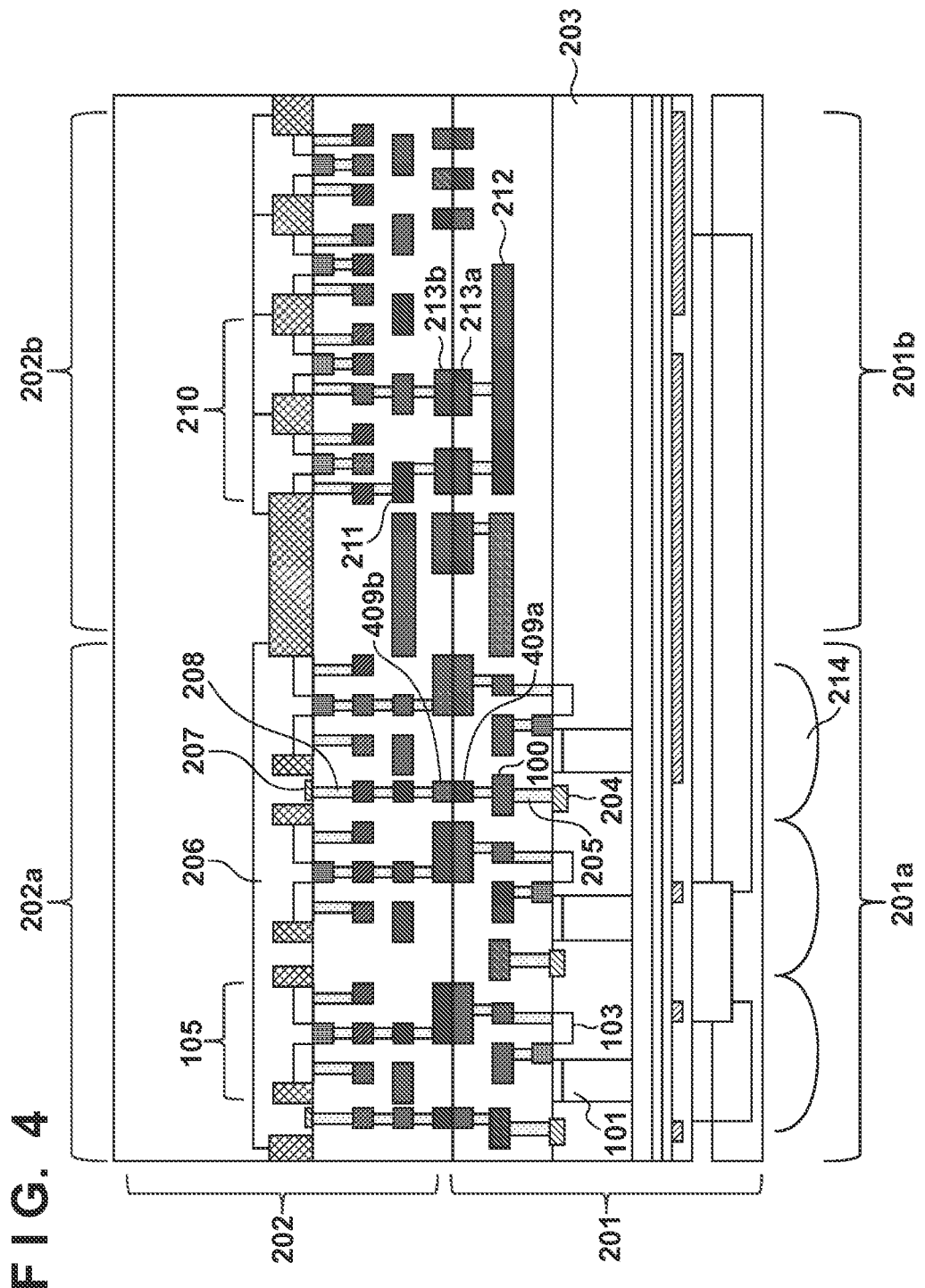
FIG. 4 is an exemplary schematic cross-sectional view of a solid-state imaging device according to a modification example of the first embodiment of the present invention.

A description is now given of a modification example of the first embodiment with reference to FIG. 4. FIG. 4 is an exemplary schematic cross-sectional view of a solid-state imaging device according to a modification example of the first embodiment of the present invention. In this modification example, the semiconductor substrate 201 has connection parts 409a that are partially exposed on the principal surface of the semiconductor substrate 201. The semiconductor substrate 202 has connection parts 409b that are partially exposed on the principal surface of the semiconductor substrate 202. When the principal surface of the semiconductor substrate 201 and the principal surface of the semiconductor substrate 202 are arranged facing each other, the connection parts 409a are connected to the connection parts 409b, and the ground line 100 in the semiconductor substrate 201 is electrically connected to the well region 206 in the semiconductor substrate 202. As with the connection parts 209a and 209b, the connection parts 409a and 409b may be formed as electrically conductive patterns of top wiring layers. The above configuration, in which the ground line 100 is formed only in the semiconductor substrate 201 and the ground line 110 is not formed in the semiconductor substrate 202, can increase the degree of flexibility in the layout of the semiconductor substrate 202.

When the semiconductor substrates 201 and 202 are attached to each other with a slight misalignment, or when the attached faces thereof have poor smoothness, connection problems may occur between the connection parts 409a and 409b. As a result, ground potential cannot be supplied to the well region 206. In the present modification example, ground potential is supplied to the well region 206 of the semiconductor substrate 202, which has a small number of contact plugs, via the connection parts 409a and 409b. Accordingly, the number of connection parts 409a and 409b can be reduced, and the probability of the occurrence of connection problems can be lowered. A plurality of modification examples that have been explained with respect to the first embodiment may be applied in combination.

Figure 5A:
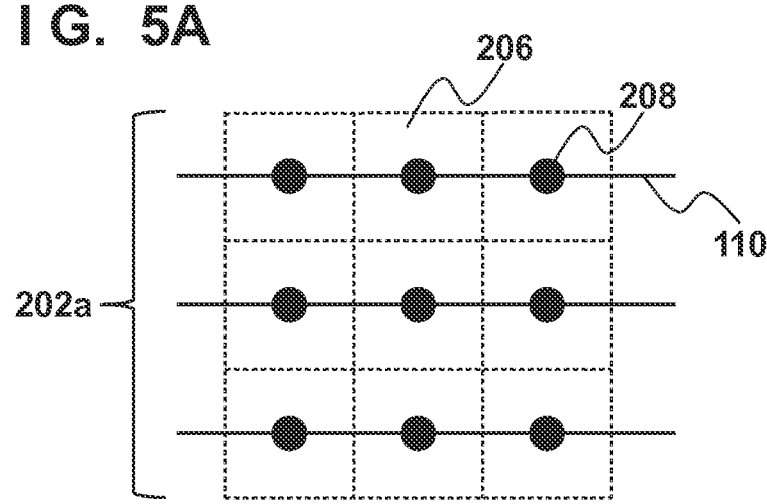
FIGS. 5A and 5B are diagrams for schematically explaining an example of arrangement of contact plugs in a solid-state imaging device according to a second embodiment of the present invention.
Figure 5B:
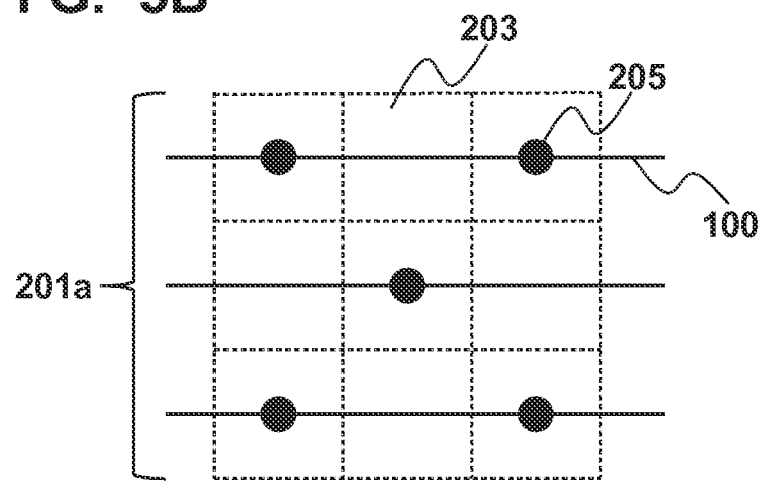

A description is now given of a solid-state imaging device according to the second embodiment of the present invention with reference to FIGS. 5A and 5B. FIGS. 5A and 5B are diagrams for schematically explaining an example of arrangement of contact plugs in the solid-state imaging device according to the second embodiment of the present invention. The following mainly describes differences from the first embodiment, and matters that are not particularly mentioned are similar to the first embodiment. Furthermore, the modification examples that have been explained with respect to the first embodiment are applicable to the present embodiment as well.

In the present embodiment, the number of contact plugs 205 in the pixel array of the semiconductor substrate 201 is smaller than the number of contact plugs 208 in the pixel array of the semiconductor substrate 202. More specifically, one contact plug 205 is arranged for every two pixels on the semiconductor substrate 201, whereas one contact plug 208 is arranged for every pixel on the semiconductor substrate 202. The potential of the well region 206 in which the amplifier transistors 105 and the reset transistors 104 are formed is important in determining the operational characteristics of the transistors. When the potential of the well region 206 is distributed depending on locations in the pixel array, shading may occur in signals as an offset that varies with each pixel array. Shading can be suppressed by supplying ground potential to the well region 206 in the pixel array of the semiconductor substrate 202 with a large number of contact plugs 208 arranged in the well region 206. On the other hand, when a large number of contact plugs 205 are arranged in the well region 203 of the semiconductor substrate 201 where the photoelectric conversion portions 101 are arranged, a large amount of dark current may flow through the photoelectric conversion portions 101 via the contact plugs 205. The occurrence of dark current in the photoelectric conversion portions 101 has adverse effects especially on images in a dark state. Furthermore, because the contact plugs 205 restrict the areas of the photoelectric conversion portions 101, the areas of the photoelectric conversion portions 101 that can receive light are reduced. This may result in a decrease in the sensitivity. By reducing the number of the contact plugs 205 arranged in the pixel array of the semiconductor substrate 201, restriction of the areas of the photoelectric conversion portions 101 can be alleviated, and the occurrence of dark current can be suppressed. In the above manner, the present embodiment can achieve not only suppression of dark current and improvement in the sensitivity, namely a high S/N ratio, but also suppression of shading. Furthermore, as with the modification examples that have been explained with respect to the first embodiment, ground potential may be supplied from the ground line 100 in the semiconductor substrate 202 to the well region 203 in the semiconductor substrate 201.

The following describes a camera in which any of the solid-state imaging devices according to the above embodiments is built as an exemplary application thereof. The concept of a camera includes not only devices that perform imaging as a primary purpose thereof, but also devices that are supplementarily provided with an imaging function (e.g. personal computers and mobile terminals). The camera is composed of any of the solid-state imaging devices according to the present invention, which have been exemplarily described as the above embodiments, and a signal processing unit that processes signals output from this solid-state imaging device. The signal processing unit may include, for example, an A/D converter and a processor that processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-266274, filed Dec. 5, 2011, which is hereby incorporated by reference herein in its entirety.

What is claimed is:

1. A solid-state imaging device comprising:
a first semiconductor substrate including a plurality of photoelectric conversion portions included in a plurality of pixels, the plurality of photoelectric conversion portions being disposed in a first well region;
a second semiconductor substrate overlapping the first semiconductor substrate and including a circuit configured to amplify a signal from the pixel, the circuit including a transistor and a source and/or a drain of the transistor being disposed in a second well region that overlaps the first well region;
a plurality of first contact plugs connected to the first well region of the first semiconductor substrate at parts other than the plurality of photoelectric conversion portions; and
a plurality of second contact plugs connected to the second well region of the second semiconductor substrate at parts other than the source and/or the drain of the transistor,
wherein a number of the plurality of first contact plugs is different than a number of the plurality of second contact plugs.

2. The device according to claim 1, wherein the first semiconductor substrate includes a plurality of floating diffusions and a plurality of transfer transistors included in the plurality of pixels.

3. The device according to claim 1, further comprising a plurality of lenses disposed on a first side of the first semiconductor substrate, the first side being opposite to a second side of the first semiconductor substrate facing the second substrate.

4. The device according to claim 1, further comprising an electrically conductive pattern connecting the plurality of first contact plugs and the plurality of second contact plugs.

5. The device according to claim 1, wherein the second semiconductor substrate includes a parallel processing circuit configured to process signals from the plurality of pixels in parallel.

6. The device according to claim 1, wherein the first semiconductor substrate and the second semiconductor substrate are attached to each other.

7. The device according to claim 1, wherein the number of the plurality of first contact plugs is greater than the number of the plurality of second contact plugs.

8. The device according to claim 1, wherein the number of the plurality of second contact plugs is greater than the number of the plurality of first contact plugs.

9. The device according to claim 1, wherein
the first well region has a different conductivity type than the plurality of photoelectric conversion portions, and
the second well region has a different conductivity type than the source and/or the drain of the transistor.

10. The device according to claim 1, wherein
the first well region includes first well contact regions and the plurality of first contact plugs are connected to the first well region at the first well contact regions, and
the second well region includes second well contact regions and the plurality of second contact plugs are connected to the second well region at the second well contact regions.

11. A camera comprising:
the solid-state imaging device according to claim 1; and
a signal processing unit that processes signals obtained by the solid-state imaging device.

* * * * *